US005155613A

United States Patent [19]

Sakayori

[11] Patent Number: 5,155,613

[45] Date of Patent: Oct. 13, 1992

[54] DRIVING CIRCUIT OF LIQUID CRYSTAL DISPLAY WHICH HAS DELAY MEANS

[75] Inventor: Hiroyuki Sakayori, Machida, Japan

[73] Assignee: Semiconductor Energy Laboratory Co., Ltd., Kanagawa, Japan

[21] Appl. No.: 752,181

[22] Filed: Aug. 23, 1991

Related U.S. Application Data

[63] Continuation of Ser. No. 271,284, Nov. 15, 1988, abandoned.

[30] Foreign Application Priority Data

Nov. 20, 1987 [JP] Japan ............................. 62-294587

[51] Int. Cl.[5] ......................... G02F 1/13; H03K 5/13

[52] U.S. Cl. ..................................... 359/85; 340/789; 307/592; 307/597; 307/603; 307/605

[58] Field of Search ................ 350/332, 333; 340/765, 340/784, 789, 805; 307/264, 268, 592, 597, 602, 603, 605, 606; 359/84, 85

[56] References Cited

U.S. PATENT DOCUMENTS

| | | | |
|---|---|---|---|
| 4,050,064 | 9/1977 | Hashimoto | 350/332 X |
| 4,099,073 | 7/1978 | Hashimoto et al. | 350/332 |
| 4,158,786 | 6/1979 | Hirasawa | 350/332 X |
| 4,405,868 | 9/1983 | Lockwood | 307/264 X |
| 4,646,074 | 2/1987 | Hashimoto | 350/332 X |
| 4,748,444 | 5/1988 | Arai | 340/784 |
| 4,802,739 | 2/1989 | Iwamoto | 350/332 |
| 4,824,218 | 4/1989 | Kuno et al. | 350/350 S |
| 4,870,398 | 9/1989 | Bos | 340/784 |

FOREIGN PATENT DOCUMENTS

| | | | |
|---|---|---|---|
| 3501982 | 7/1985 | Fed. Rep. of Germany . | |
| 0160124 | 9/1984 | Japan | 350/332 |
| 0294417 | 12/1986 | Japan | 350/332 |
| 0025730 | 2/1987 | Japan | 350/332 |

*Primary Examiner*—Stanley D. Miller
*Assistant Examiner*—Huy K. Mai
*Attorney, Agent, or Firm*—Sixbey, Friedman, Leedom & Ferguson

[57] ABSTRACT

A driving circuit for liquid crystal display is disclosed and includes a circuit for outputting driving signals to a ferroelectric liquid crystal display in order to construct visual information in the display and a voltage source for supplying a predetermined voltage such that when the display system is switched off the circuit means outputs an erasing signal to the liquid crystal display for erasing all of the visual information displayed in the display and eliminates phantom figures from appearing when the display is reused.

2 Claims, 3 Drawing Sheets

DRIVING CIRCUIT OF LIQUID CRYSTAL DISPLAY WHICH HAS DELAY MEANS

This application is a continuation of Ser. No. 07/271,284, filed Nov. 15, 1988, now abandoned.

BACKGROUND OF THE INVENTION

The present invention relates to a driving circuit of liquid crystal displays.

Heretofore, liquid crystal displays utilizing ferroelectric liquid crystals have attracted interest of researchers since they have apparent hysteresis properties. The displays of this kind have memory functions which are desirable in some applications. However, if a displayed image remains for a long time in the liquid crystal display after the display system is switched off, the quality of images displayed is degraded when the operation of the system is resumed, due to the "printing" of the previous displayed image (after image).

SUMMARY OF THE INVENTION

It is an object of the present invention to provide a driving circuit for liquid crystal display without the adverse effect due to "after image" after the display system is switched off.

In order to accomplish the above and other objects, all the displayed image is clearly erased. The erasure is performed by applying driving signals which are biassed in order to output signals causing the pixels constituting the liquid crystal display to take "0" states.

DETAILED DESCRIPTION OF THE PREFERRED EMBODIMENTS

Figure 1:
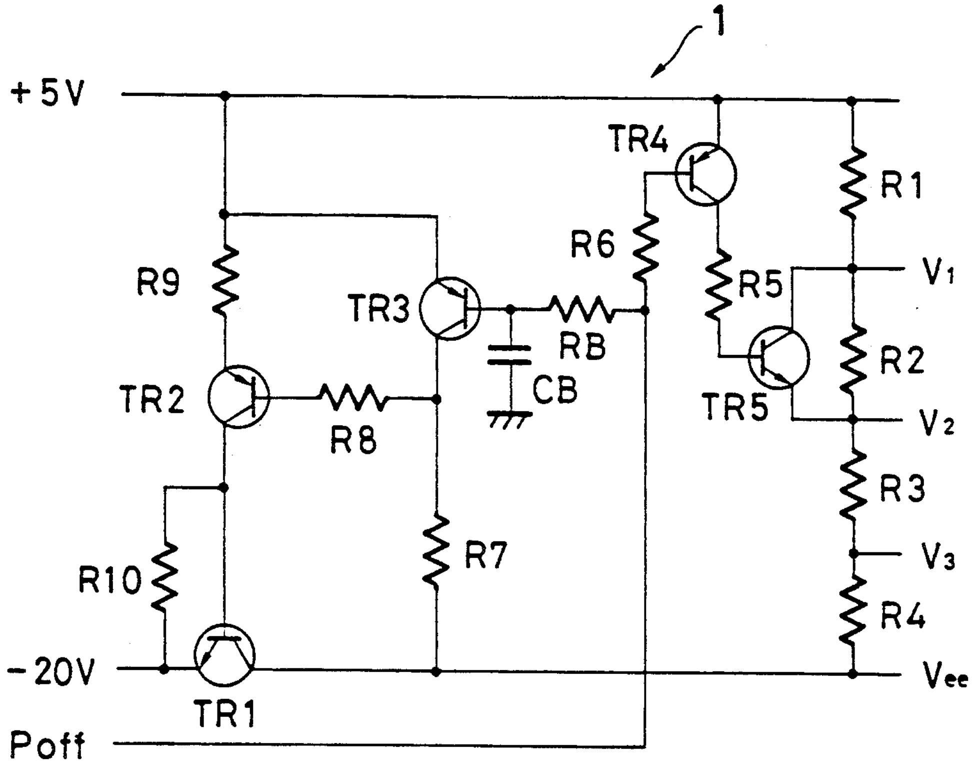
FIGS. 1(A) and 1(B) are diagrams showing a driving circuit for liquid crystal display in accordance with the present invention.
Figure 1:
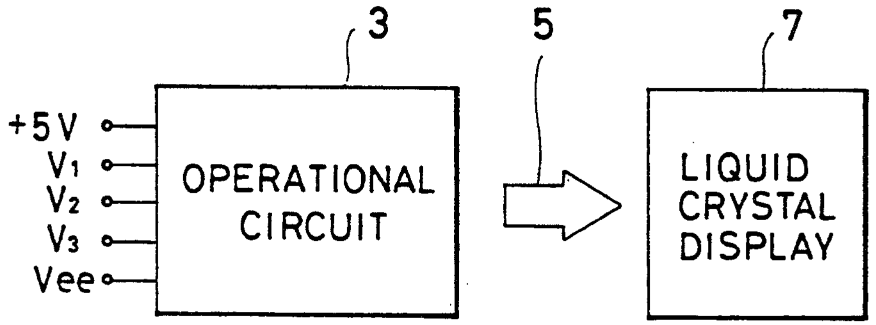
Figure 2:
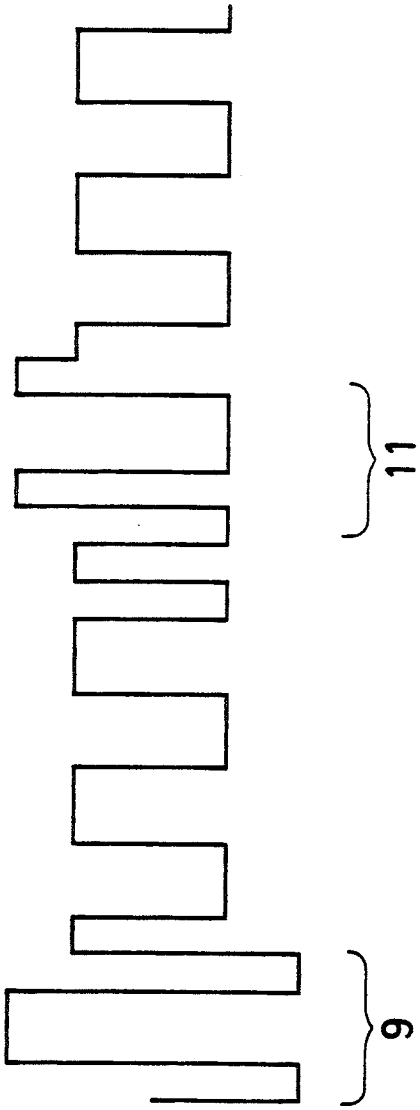
FIGS. 2(A) and 2(B) are schematic diagrams showing the driving signal during operation and the erasing signal respectively.
Figure 2:
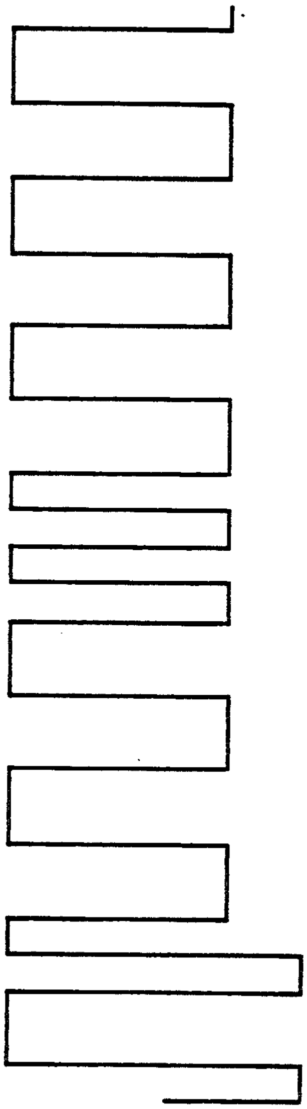

Referring now to FIGS. 1(A) and 1(B), a driving circuit of liquid crystal display is illustrated in accordance with the present invention. The display to be driven by this circuit is a ferroelectric liquid crystal display comprising a number of pixels arranged in a matrix. The circuit consists of a voltage divider 1 and an operational circuit 3. The function of the voltage divider illustrated in FIG. 1(A) is to divide the voltage between Vdd (+5 V) and Vee connected to a voltage source of −20 V through a TR1 and output three intermediate voltage levels $V_1$, $V_2$ and $V_3$ to the operational circuit illustrated in FIG. 1(B). The operational circuit produces necessary voltage levels by use of the three voltage levels and outputs driving signals 5 such as illustrated in FIG. 2(A) to the liquid crystal display 7. The signal portion 9 causes a pixel to take a "1" state while the signal portion 11 to take a "0" state. The four level appearing in FIG. 2(A) are obtained in the operational circuit by carrying out the addition and the subtraction among the voltage levels supplied thereto. A pixel of the display takes a "1" state at the lowest level and a "0" state at the highest level. The two intermediate states cause no change to the pixels.

The divider functions to modify the voltage levels supplied to the operational circuit in order to obtain driving signals as illustrated in FIG. 2(B), when the display device is closed. This is accomplished by shorting the terminals of $V_1$ and $V_2$. For example, in case that the highest level corresponds to $V_1$ and the next high level to $V_2$, the next high level is elevated to the highest level.

Next, the operation of the divider will be described. Four resistances R1, R2, R3 and R4 are connected between the Vdd terminal and the Vee terminal in series in order to produce divided levels at the $V_1$ terminal, the $V_2$ terminal and the $V_3$ terminal. A TR5 is coupled with the R2 in parallel. The base terminal of the TR5 is connected to the Vdd terminal through a t4 and a R5. The base terminal of the TR4 is in turn connected to a power-off terminal Poff through a R6. The level at Poff is maintained at +5 V (=the Vdd level) during operation and grounded (OV) when the display system is switched off. During operation, the TR4 and the TR5 are turned off and a predetermined voltage is given across the R2. When the display system is switched off and the Poff level is ground, the TR4 and the TR5 are turned on and eventually the $V_1$ terminal and the $V_2$ terminal are shorted.

The voltage level at the Poff terminal indicative of the on-off condition of the display system is supplied also to the base terminal of a TR3 through a delay circuit comprising a R8 and a capacitor C8. The TR3 is connected between the Vdd terminal and the base terminal of a TR2 through a R8. The emitter terminal of the TR2 is connected to the Vdd terminal through a R9 and the collector terminal to the base terminal of the TR1. A R10 is connected between the base and emitter terminals of the TR1. During operation, the TR3 is turned off with the Poff level being 5 V and the TR2 and the TR1 are kept turned on. When the Poff level is ground, the TR3 is turned off after the delay time of the delay circuit, followed by turning off of the TR2 and the TR1. Eventually, the Vee terminal is disconnected from the voltage source of −20 V.

Figure 3:
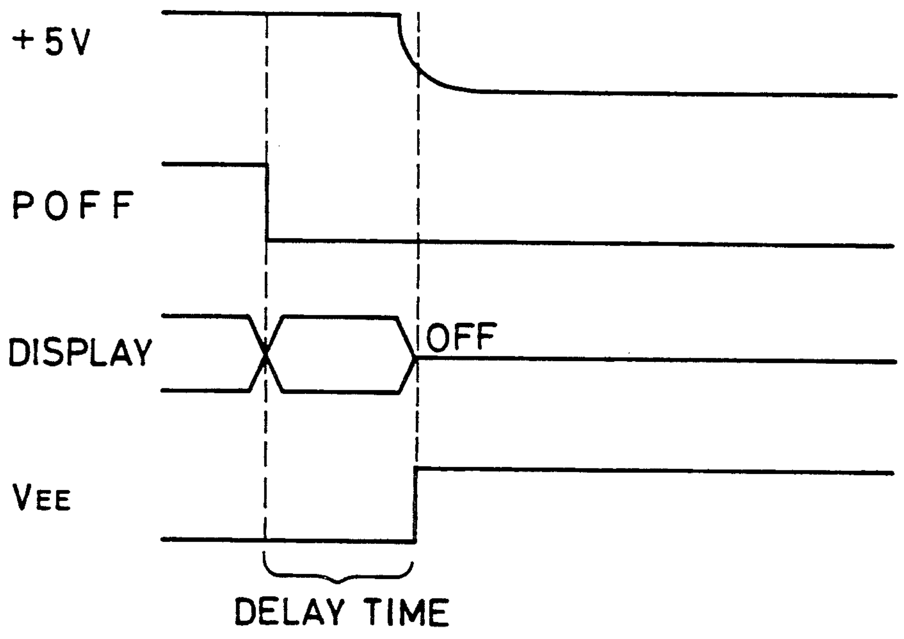
FIG. 3 is a timing chart illustrating the operation of the driving circuit in accordance with the present invention.

Accordingly, when the display system is switched off, the modified driving signals are supplied to the liquid crystal display 7 and then the system is completely closed after the time delay. This is schematically illustrated in FIG. 3.

While several embodiments have been specifically described, it is to be appreciated that the present invention is not limited to the particular examples described and that modifications and variations can be made without departure from the scope of the invention as defined by the appended claims. Particularly, although a driving signal pattern is illustrated in FIG. 2(A), various types of driving signal pattern have been employed and the present invention can be applied to any type of these pattern.

I claim:

1. A driving and switching off circuit for a liquid crystal display device having a memory effect and a plurality of pixels, each pixel having the capability of exhibiting two states in accordance with an electric field applied thereto, said circuit comprising:

driving means for applying a drive signal to said display device to cause all of said pixels to uniformly exhibit one of said two states; and delay means for providing a delay signal ending subsequent to the application of said drive signal;

means responsive to said delay means for switching off said display device subsequent to causing all the pixels to uniformly exhibit said one state.

2. A method for driving and switching off a liquid crystal display device having a memory effect and a plurality of pixels, each pixel having the capability of exhibiting two states in accordance with an electric field applied thereto, said method comprising the steps of:

generating a turn off signal to turn off said display device;

applying a drive signal. in response to said turn off signal, to said display device to cause all of said pixels to uniformly exhibit one of said two states; and delaying said turn off signal to provide a delayed turn off signal ending subsequent to the application of said drive signal;

thereafter, in response to the delayed turn off signal, switching off said display device.

* * * * *

Adverse Decisions In Interference

Patent No. 5,155,613, Hiroyuki Sakayori, DRIVING CIRCUIT OF LIQUID CRYSTAL DISPLAY WHICH HAS DELAY MEANS, Interference No. 103,923, final judgment adverse to the patentee rendered March 4, 1998, as to claims 1 and 2.

*(Official Gazette July 7, 1998)*